(12) United States Patent
Yoshimoto (10) Patent No.: US 7,816,158 B2
(45) Date of Patent: Oct. 19, 2010

(54) LIQUID CRYSTAL DISPLAY DEVICE AND METHOD FOR MANUFACTURING THE SAME

(75) Inventor: Yoshikazu Yoshimoto, Sendai (JP)

(73) Assignee: Future Vision Inc., Tokyo (JP)

( * ) Notice: Subject to any disclaimer, the term of this patent is extended or adjusted under 35 U.S.C. 154(b) by 768 days.

(21) Appl. No.: 11/452,978

(22) Filed: Jun. 15, 2006

(65) Prior Publication Data

US 2007/0138469 A1    Jun. 21, 2007

(30) Foreign Application Priority Data

Dec. 20, 2005   (JP)   ............... 2005-365739

(51) Int. Cl.
*H01L 29/04*   (2006.01)
(52) U.S. Cl. ............... 438/30; 438/128; 438/48; 438/151; 438/157; 438/161; 438/283; 257/E27.132; 257/E27.1; 257/E31.097; 257/E29.117; 257/57; 257/59; 257/72; 257/368; 257/79
(58) Field of Classification Search ............ 257/79, 257/59, E27.132, E31.097, E27.1, E29.117, 257/57, 72, 257; 438/30, 48, 128, 151, 157, 438/161, 283
See application file for complete search history.

(56) References Cited

U.S. PATENT DOCUMENTS

| | | | |
|---|---|---|---|
| 5,365,079 A | 11/1994 | Kodaira et al. | |
| 5,631,473 A | 5/1997 | Possin | |
| 2005/0095356 A1 | 5/2005 | Nakamura et al. | |
| 2006/0091394 A1* | 5/2006 | Honda | 257/66 |
| 2009/0213289 A1* | 8/2009 | Yoshimoto | 349/46 |

FOREIGN PATENT DOCUMENTS

| | | |
|---|---|---|
| EP | A-750350 | 12/1996 |
| JP | 09-045774 | 2/1997 |
| JP | 2000-133649 | 5/2000 |
| JP | 2003-318193 | 11/2003 |
| JP | 2005-227538 | 8/2005 |
| KR | 20030073006 | 9/2003 |
| TW | 1243189 | 11/1998 |
| TW | 1241310 | 7/2000 |
| TW | 200305287 | 10/2003 |
| WO | WO 2004-086487 | 10/2004 |

* cited by examiner

*Primary Examiner*—Wael M Fahmy
*Assistant Examiner*—Marc Armand
(74) *Attorney, Agent, or Firm*—Antonelli, Terry, Stout & Kraus, LLP.

(57) ABSTRACT

The present invention provides a liquid crystal display device to be operated at high speed and with high precision by improving performance of a thin-film transistor without increasing cross capacity of gate lines and data lines. On an upper layer of a gate insulator GI at an intersection of gate lines GL and data lines DL to be prepared on an active matrix substrate SUB1, which makes up a liquid crystal display panel of a liquid crystal display device, an insulating material with low dielectric constant is dropped by ink jet coating method to prepare another insulator LDP in order to improve performance characteristics of the thin-film transistor to be prepared on a silicon semiconductor layer SI without increasing cross capacity on said intersection.

5 Claims, 10 Drawing Sheets

FIG.1

(1) Preparation of gate electrode

⬇ 3-layer CVD (2) Formation of island

⬇

(3) Ink Jet coating of the crossing portion

⬇

(4) Formation of source and channel

⬇

Formation of pixels

(1) Preparation of gate electrode (2) Ink Jet coating of the crossing portion 3-layer CVD (3) Formation of island (4) Formation of source and channel

Formation of pixels

(1) Preparation of gate electrode

⬇ 3-layer CVD (2) Formation of island (or formation of TFT)

⬇

(3) Ink Jet coating of the crossing portion

⬇

(4) Formation of source and channel

⬇

Formation of pixels

(1) Preparation of gate electrode

⇩

(2) Ink Jet coating of the crossing portion

⇩ 3-layer CVD (3) Formation of island (or formation of TFT)

⇩

(4) Formation of source and channel

⇩

Formation of pixels

(1) Preparation of gate electrode

⇩ 3-layer CVD (2) Formation of island

⇩

(3) Ink Jet coating of the gate line portion

⇩

(4) Formation of source and channel

⇩

Formation of pixels

(1) Preparation of gate electrode (2) Ink Jet coating of the gate line portion 3-layer CVD (3) Formation of island (4) Formation of source and channel

Formation of pixels

(1) Preparation of gate electrode

⇓ 3-layer CVD (2) Formation of island (or formation of TFT)

⇓

(3) Ink Jet coating of the gate line portion

⇓

(4) Formation of source and channel

⇓

Formation of pixels

(1) Preparation of gate electrode (2) Ink Jet coating of the gate line portion

⇩ 3-layer CVD (3) Formation of island (or formation of TFT)

(4) Formation of source and channel

Formation of pixels

LIQUID CRYSTAL DISPLAY DEVICE AND METHOD FOR MANUFACTURING THE SAME

FIELD OF THE INVENTION

The present invention relates to a liquid crystal device of active matrix type and to a method for manufacturing the same. In particular, the invention relates to a thin-film transistor formed on one of substrates of a liquid crystal display panel, which makes up the liquid crystal display device. The invention also relates to a method for manufacturing the same.

BACKGROUND ART

A liquid crystal display panel to make up a liquid crystal display device of active matrix type has a liquid crystal interposed between a substrate (an active matrix substrate) and another substrate (a color filter substrate). In a manufacturing process to prepare a thin-film transistor (TFT) on the active matrix substrate, a plurality of gate lines disposed in parallel to each other and comprising metal film such as chromium are prepared on said substrate, and a gate electrode extending from each of said gate lines to each pixel is formed.

Figure 17A:
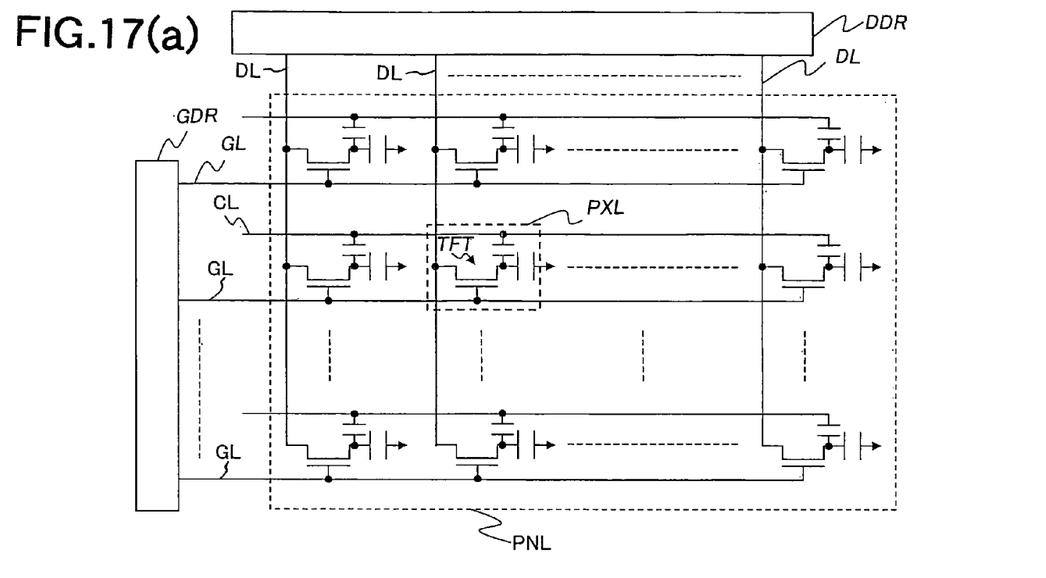
FIG. 17 represents an equivalent circuit of a display panel unit of a liquid crystal display device of active matrix type.
Figure 17B:
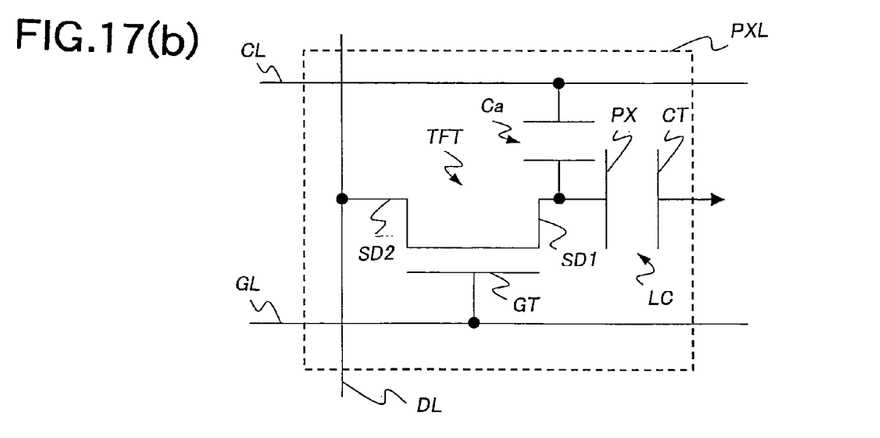

FIG. 17 represents diagrams to explain an equivalent circuit of a display panel of a liquid crystal display device of active matrix type. FIG. 17(a) is a circuit diagram of the entire device, and FIG. 17(b) is an enlarged view of the diagram of a pixel unit PXL in FIG. 17(a). In FIG. 17(a), a multiple of pixel units PXL are arranged in matrix-like form on a display panel PNL. Each pixel PXL is selected at a scan line driving circuit GDR and is turned on according to a display data signal from a data line (also called "source line") driving circuit DDR.

Specifically, in response to the gate line GL selected by the scan line driving circuit GDR, a display data (voltage) is sent to a thin-film transistor TFT on the pixel unit PXL of the display panel PNL via a data line DL from the data line driving circuit DDR.

As shown in FIG. 17(b), the thin-film transistor TFT to constitute the pixel unit PXL is provided at an intersection of the gate line GL and the data line DL. The gate line GL is connected to a gate electrode GT of the thin-film transistor TFT, and the data line DL is connected to a drain electrode or a source electrode ("drain electrode" at this moment) SD2 of the thin-film transistor TFT.

The drain electrode or the source electrode ("source electrode" at this moment) SD1 of the thin-film transistor TFT is connected to a pixel electrode PX of a liquid crystal (element) LC. The liquid crystal LC is positioned between a pixel electrode PX and a common electrode CT and is driven by a data (voltage) to be supplied to the pixel electrode PX. An auxiliary capacity Ca to temporarily maintain the data is connected between the drain electrode SD2 and an auxiliary capacity line CL.

Figure 18A:
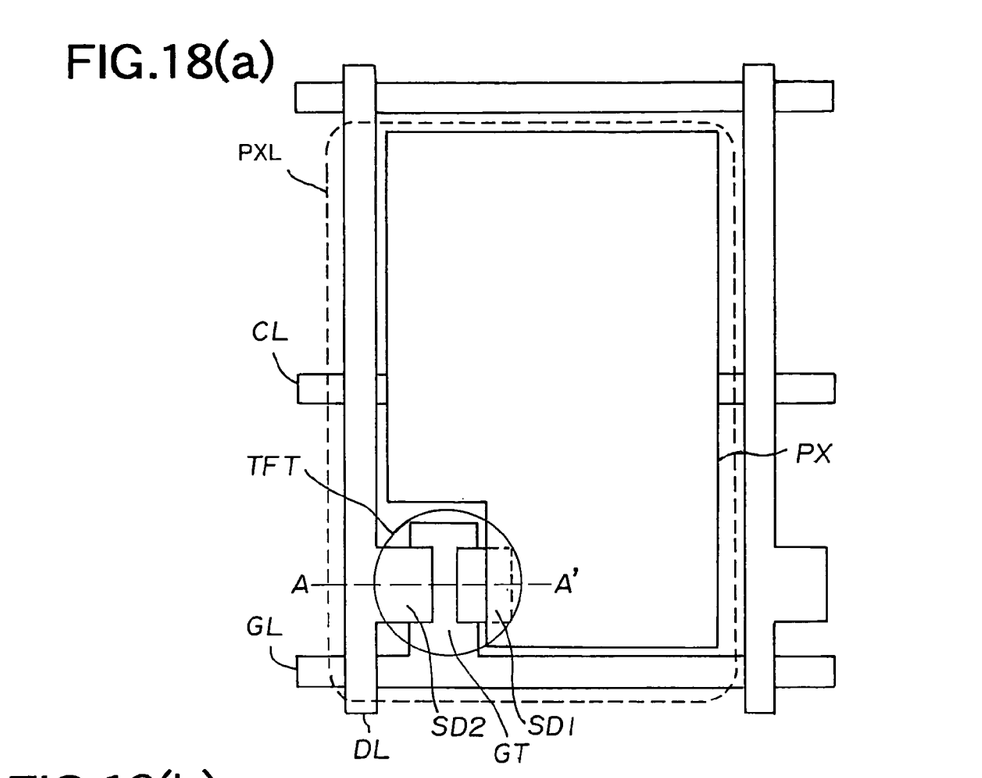
FIG. 18 represents drawings to explain an arrangement of a pixel unit PXL of a display panel PNL shown in FIG. 17 and an arrangement of a thin-film transistor TFT to constitute a pixel unit PXL.
Figure 18B:
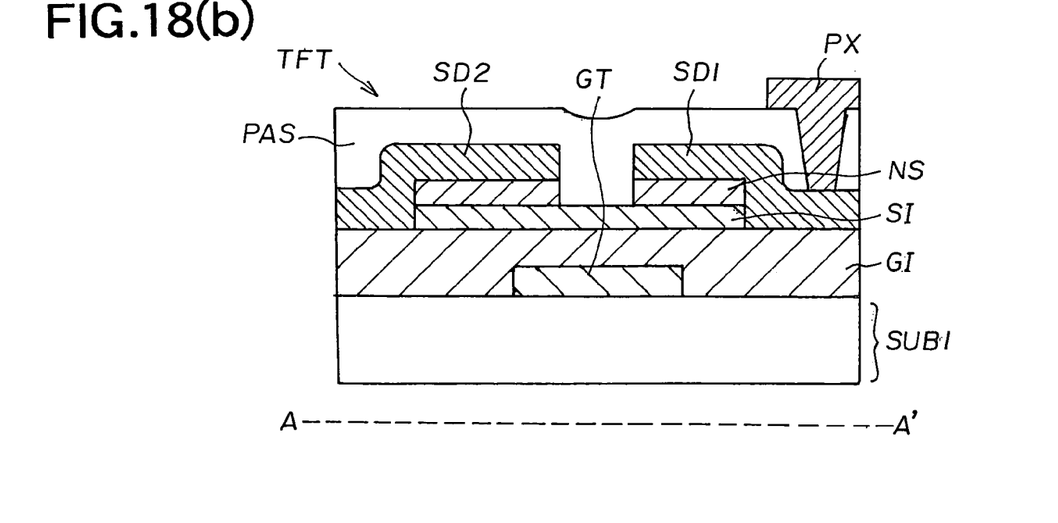

FIG. 18 represents a plan view to show a pixel unit PXL of a display panel PNL shown in FIG. 17 and a cross-sectional view to explain an arrangement of a thin-film transistor TFT to make up the pixel unit PXL. Specifically, FIG. 18(a) is a plan view of a pixel unit PXL arranged in matrix-like form as shown in FIG. 17, and FIG. 18(b) is a cross-sectional view of the thin-film transistor TFT in the pixel unit PXL along the line A-A'.

As shown in FIG. 18(a), in the pixel unit PXL arranged in matrix-like form, the thin-film transistor TFT is disposed at an intersection of the gate line GL and the data line DL. Also, a pixel electrode PX is connected to the thin-film transistor TFT, and an auxiliary capacity is formed with the auxiliary capacity line CL.

In FIG. 18(b), in the thin-film transistor TFT, a gate electrode GT and a gate insulator GI to cover the gate electrode GT are prepared on an insulating substrate SUB1. On the insulator, a silicon (Si) semiconductor layer SI, an ohmic contact layer (n$^+$ Si) NS, a source electrode SD1 and a drain electrode SD2 are sequentially laminated on the insulator.

To prepare a gate insulator GI, silicon nitride (SiNx) is deposited to cover the gate line GL and the gate electrode GT, and a plurality of data lines DL are prepared to intersect the gate lines GL. At the same time as the preparation of the data lines DL, the source electrode SD1 and the drain electrode SD2 are formed on the same layer.

As described above, in a region enclosed by each gate line GL and each data line DL, a unit pixel comprising a pixel unit PXL is provided. This unit pixel has a sub-pixel of a single color (red, green, or blue) in case of full-color display. Hereinafter, the unit pixel is also simply referred as "pixel". The thin-film transistor (TFT) to make up the pixel unit PXL comprises, as described above, a gate electrode, a silicon semiconductor film prepared by patterning on the gate electrode, an ohmic contact layer (n$^+$ silicon) separately formed on upper layer of the silicon semiconductor film, and a source electrode and a drain electrode connected respectively to the separated ohmic contact layer.

On the upper layer of the thin-film transistor, a protective layer PAS is deposited. On it, a pixel electrode PX—preferably made of ITO, is prepared by patterning, and it is connected to the source electrode (or to the drain electrode) SD1 via a contact hole provided in the protective film PAS. An orientation film (not shown) is deposited to cover the pixel electrode PX.

On the other hand, on another substrate (not shown in the figure), a counter electrode (in FIG. 17(b)) is prepared via a smooth layer (overcoat layer) and a 3-color filter (in case of full-color display). An orientation film is deposited to cover the counter electrode. An active matrix substrate (i.e. one of the substrates as described above) is superimposed on it, and a liquid crystal is sealed in a gap therebetween.

The Patented Reference 1 as given below discloses a method for manufacturing lines of the active matrix substrate as described above by means of ink jet coating method. In the Patented Reference 1, the gate electrode of the thin-film transistor TFT is prepared by ink jet coating method using a liquid containing a conductive material. Also, it is described that a source electrode and a drain electrode of the thin-film transistor are prepared by ink jet coating method using a liquid containing a semiconductor material.

[Patented Reference 1] JP-2003-318193

The gate insulator to be formed on the active matrix substrate of the liquid crystal display panel is provided to insulate the gate line and data line. The thinner the gate insulator is, the more the performance of the thin-film transistor are improved. Also, the thinner the gate insulator is, the finer the auxiliary capacity line can be produced, and this contributes to the improvement of aperture rate. However, when the gate insulator is thinner, cross capacity at the intersection with the data line is increased, and this results in the delay of signal. Also, the counter capacity between the gate line and the counter electrode is also increased. If the gate insulator is designed thicker to reduce the cross capacity and counter capacity, performance of the thin-film transistor are decreased as described above.

It is an object of the present invention to provide a liquid crystal display device, which can be operated at high speed and with high precision by improving performance characteristics of the thin-film transistor without increasing cross capacity and counter capacity.

SUMMARY OF THE INVENTION

To attain the above object, according to the present invention, another insulator is provided by dropping an insulating material with low dielectric constant by ink jet coating method to an upper layer or to a lower layer of the gate insulator at the intersection of the gate line and the data line, and performance characteristics of the thin-film transistor is improved without increasing cross capacity at the intersection and a capacity from the counter electrode (counter capacity).

Also, according to the present invention, an insulating material with low dielectric constant is dropped by ink jet coating method along the gate line including an intersection with the data line to an upper layer or to a lower layer of a gate insulator to cover the gate line. Thus, the performance characteristics of the thin-film transistor are improved without increasing cross capacity at the intersection and a capacity (counter capacity) with the counter electrode.

After the formation of the data lines, the source electrode, and the drain electrode, a silicon semiconductor layer is deposited and a semiconductor island is prepared by patterning. Then, the thin-film transistor is provided by preparing an ohmic conduct layer, the source electrode, and the drain electrode. After the formation of a protective film, a pixel electrode connected to the source electrode (or drain electrode) of the thin-film transistor is prepared via a contact hole opened in the protective film. Then, the liquid crystal display panel is prepared by a process already known, and the liquid crystal display device can be provided.

According to the present invention, it is possible to provide coating of an insulating material with low dielectric constant to the extent as necessary only on the intersection of the gate line and the data line or on the gate line including the intersection and to an upper layer or to a lower layer of the gate insulator. Thus, without increasing cross capacity of the intersection and the capacity (counter capacity) with the counter electrode and without the need to remove unnecessary portion and to perform subsequent process, performance characteristics of the thin-film transistor can be improved. When the insulating material is dropped by ink jet coating, peripheral edge of the insulator can be prepared in a tapered form with gentle slope. Thus, disconnection can be avoided, which may be caused by skipping over as data line goes over the gate line when crossing.

DETAILED DESCRIPTION OF THE PREFERRED EMBODIMENTS

Detailed description will be given below on embodiments of the present invention referring to the drawings. The structure of the liquid crystal display device of the present invention will be described in connection with the manufacturing method as given below.

Embodiment 1

Figure 1:
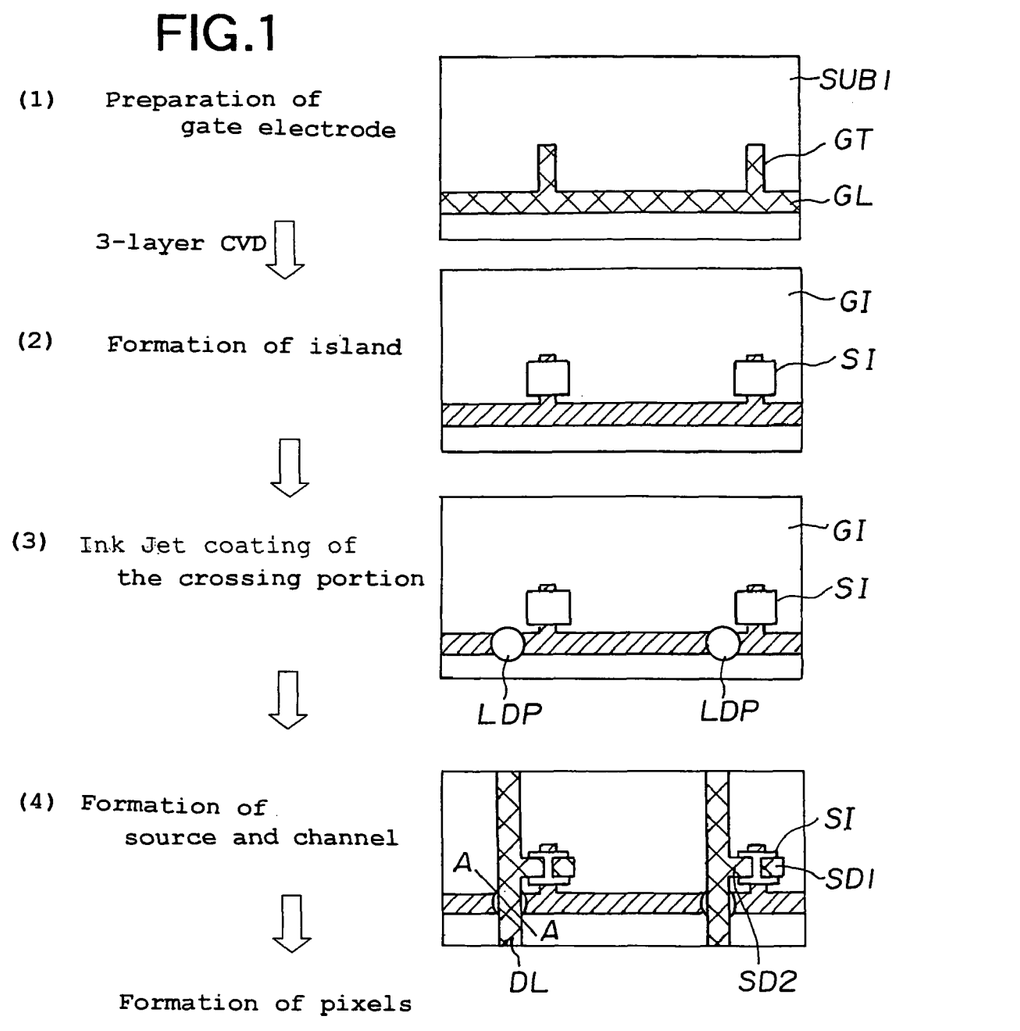
FIG. 1 represents plan views to explain essential processes of a method for manufacturing an active matrix substrate of a liquid crystal display panel, which constitutes Embodiment 1 of a liquid crystal display device according to the present invention.

FIG. 1 represents plan views to explain essential processes of a method for manufacturing an active matrix substrate of a liquid crystal display panel, which constitutes Embodiment 1 of the liquid crystal display device according to the present invention. Here, description will be given on processes to form data lines and source electrodes and drain electrodes in the processes (1) to (4). First, (1) Preparation of gate electrode: a gate line GL is prepared by patterning on surface of an insulating substrate—preferably a transparent glass substrate. On the gate line GL, a gate electrode GT of a thin-film transistor is provided to protrude on it.

(2) Preparation of island: A gate insulator GI is deposited to cover the entire area of the substrate including the gate line GL and the gate electrode GT. To form the gate insulator GI, silicon nitride (SiNx) is deposited by CVD (chemical vapor deposition). Then, an amorphous silicon semiconductor layer and an n$^+$ silicon semiconductor layer (ohmic contact layer) with silicon mixed with phosphor or the like as impurities are prepared by CVD. By processing the ohmic contact layer, which has been turned to the amorphous silicon semiconductor layer, a silicon semiconductor island SI is formed on upper portion of the gate electrode GT. In this case, the ohmic contact layer to be formed on the upper layer of the island SI is separately prepared as connecting regions of a source electrode and a drain electrode respectively.

(3) Ink jet coating of the crossing portion: Only on a crossing portion where data line crosses the gate insulator GI of the gate line, an insulating material with low dielectric constant is dropped and coated by ink jet coating, and another insulator layer LDP is formed. This another insulator LDP will be referred below as the insulator LDP with low dielectric constant.

(4) Formation of source and channel: On the gate insulator GI, and on the insulator LDP with low dielectric constant on the gate line GL, a source line, i.e. a data line DL, is formed. In this case, the source electrode SD1 and the drain electrode of the thin-film transistor are processed by patterning at the same time, and a channel is provided between the source electrode SD1 and the drain electrode. Then, the active matrix substrate is prepared through a pixel forming process such as formation of a protective film and formation of a pixel electrode and through coating process to form an orientation film.

Figure 2:
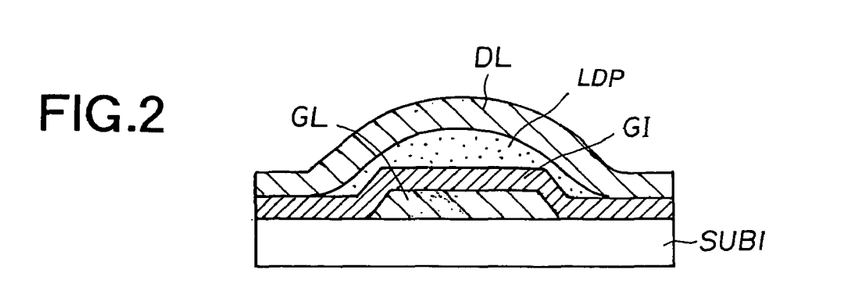
FIG. 2 is a cross-sectional view along the line A-A of the active matrix substrate when data lines are prepared in a process (4) as shown in FIG. 1.

FIG. 2 is a cross-sectional view of the active matrix substrate along the line A-A when the data line is prepared in the process (4) shown in FIG. 1. As shown in the figure, a gate line GL is formed on surface of a glass substrate SUB1. The gate insulator GI is formed over the entire surface of the glass substrate SUB1 to cover the gate line GL. On the gate line GL on a portion where the gate line GL and the data line cross each other and on the gate insulator GI, an ink of an insulating material with low dielectric constant such as an aromatic hydrocarbon type organic polymer and polyallyl ether type organic polymer is dropped by ink jet coating method. When this ink is dried up, it is turned to the insulator LDP with low dielectric constant.

On the 2-layer insulating structure of the gate insulator GI and the insulator LDP with low dielectric constant, the data lines DL are provided to cross. As shown in FIG. 2, peripheral edge of the insulator LDP with low dielectric constant dropped by ink jet coating method and hardened is turned to a tapered form with gentle slope. As a result, the data line DL crossing the gate line GL runs over the gate line GL with gentle slope, and this prevents breaking of lines caused by skip-over. Between the data line DL and a counter electrode on a color filter substrate (not shown), there is no dielectric substance, which narrows down the distance between electrodes except the above-mentioned crossing portion.

According to Embodiment 1, it is possible to improve performance characteristics of the thin-film transistor without increasing cross capacity and counter capacity and to provide a liquid crystal display device to be operated at high speed and with high precision.

Embodiment 2

Figure 3:
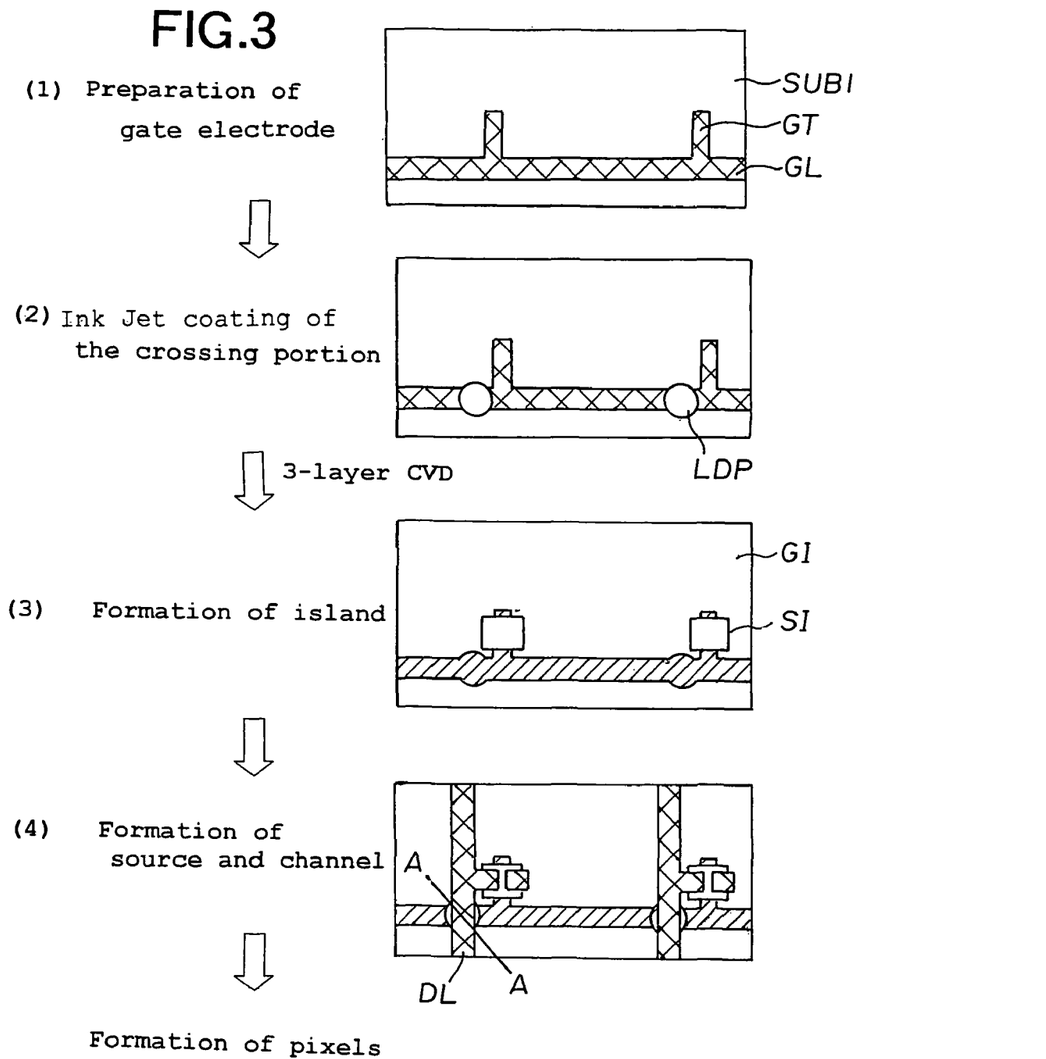
FIG. 3 represents plan views to explain essential processes of a method for manufacturing the active matrix substrate of the liquid crystal display panel, which constitutes Embodiment 2 of the liquid crystal display device of the present invention.

FIG. 3 represents plan views to explain essential processes of a method for manufacturing an active matrix substrate of a liquid crystal display panel, which makes up Embodiment 2 of the liquid crystal display device according to the present invention. Here again, the processes to prepare the data line, the source electrode and drain electrode are described in the order of (1) to (4). Similarly to Embodiment 1, first, (1) Preparation of gate electrode: A gate line GL is prepared by patterning on the surface of an insulating substrate—preferably a transparent glass substrate. On the gate line GL, a gate electrode GT of the thin-film transistor is prepared to protrude.

(2) Ink jet coating of the crossing portion: On the gate line GL and only on the crossing portion where data line intersects, an insulating material with low dielectric constant is coated by ink jet coating, and an insulator LDP with low dielectric constant is prepared.

(3) Preparation of island: A gate insulator GI is deposited over the entire Substrate including the gate line GL, the gate electrode GT, and the insulator LDP with low dielectric constant. The gate insulator GI is formed by silicon nitride (SiNx) by CVD. Similarly by CVD processing, an amorphous silicon semiconductor layer and an n$^+$ silicon semiconductor layer (ohmic contact layer) with silicon intermingled with phosphor or the like as impurities are deposited. By processing the ohmic contact layer, which has been turned to the amorphous silicon semiconductor layer, a silicon semiconductor island SI is prepared on upper portion of the gate electrode GT. In this case, the ohmic contact layer to be formed on the upper layer of the island SI is separately prepared as connecting regions of a source electrode and a drain electrode.

(4) Formation of source and channel: On the insulator LDP with low dielectric constant and on the gate insulator GI, and on the gate insulator GI on the intersecting gate line GL, a source line, i.e. a data line DL, is prepared. In this case, patterning is performed at the same time for the source electrode SD1 and the drain electrode of thin film transistor, and a channel is formed between the source electrode SD1 and the drain electrode. Then, through pixel forming process to form a protective film and a pixel electrode and through coating process to coat an orientation film, an active matrix substrate is prepared.

Figure 4:
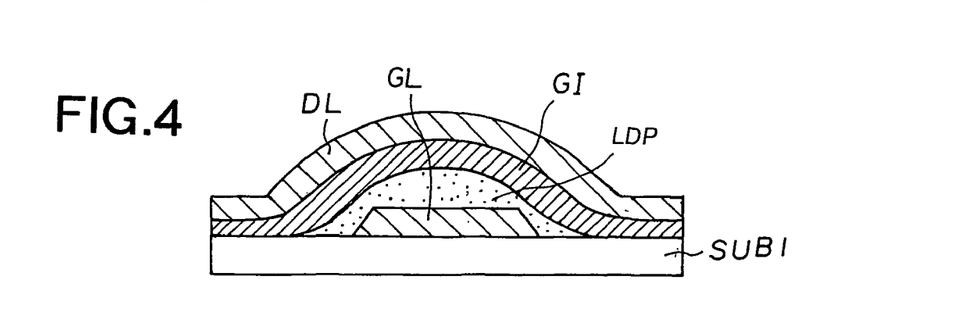
FIG. 4 is a cross-sectional view along the line A-A of the active matrix substrate when data lines are prepared in a process (4) as shown in FIG. 3.

FIG. 4 is a cross-sectional view of the active matrix substrate along the line A-A with the data line prepared in the process (4) of FIG. 3. As shown in the figure, the gate line GL is formed on the surface of a glass substrate SUB1. On the gate line GL and on a portion of the gate line GL where the data line intersects, an ink of an insulating material with low dielectric constant such as aromatic hydrocarbon type organic polymer or polyallyl ether type organic polymer is dropped and coated by ink jet coating. When the ink is dried up, it is turned to an insulator LDP with low dielectric constant. Then, a gate insulator GI is formed over the entire surface of the glass substrate SUB1 to cover the gate line GL, which has the insulator LDP with low dielectric constant at the intersection.

Then, a data line DL is disposed on a 2-layer insulating structure, which comprises the insulator LDP with low dielectric constant and the gate insulator GI. As shown in FIG. 4, peripheral edge of the insulator LDP with low dielectric constant prepared by ink jet coating and hardened is turned to a tapered form with gentle slope. It forms an edge more gently tapered than the gate insulator GI on it. As a result, the data line DL intersecting with the gate line GL goes over the gate line GL at a gentle angle. Thus, disconnection can be avoided, which may be caused by skip-over when jumping at a steep angle. Between the data line DL and a counter electrode of a color filter substrate (not shown), there is no dielectric substance, which narrows down the distance between electrodes.

According to Embodiment 2, it is possible to improve performance characteristics of the thin-film transistor without increasing cross capacity and counter capacity and to provide a liquid crystal display device to be operated at high speed and with high precision.

Embodiment 3

Figure 5:
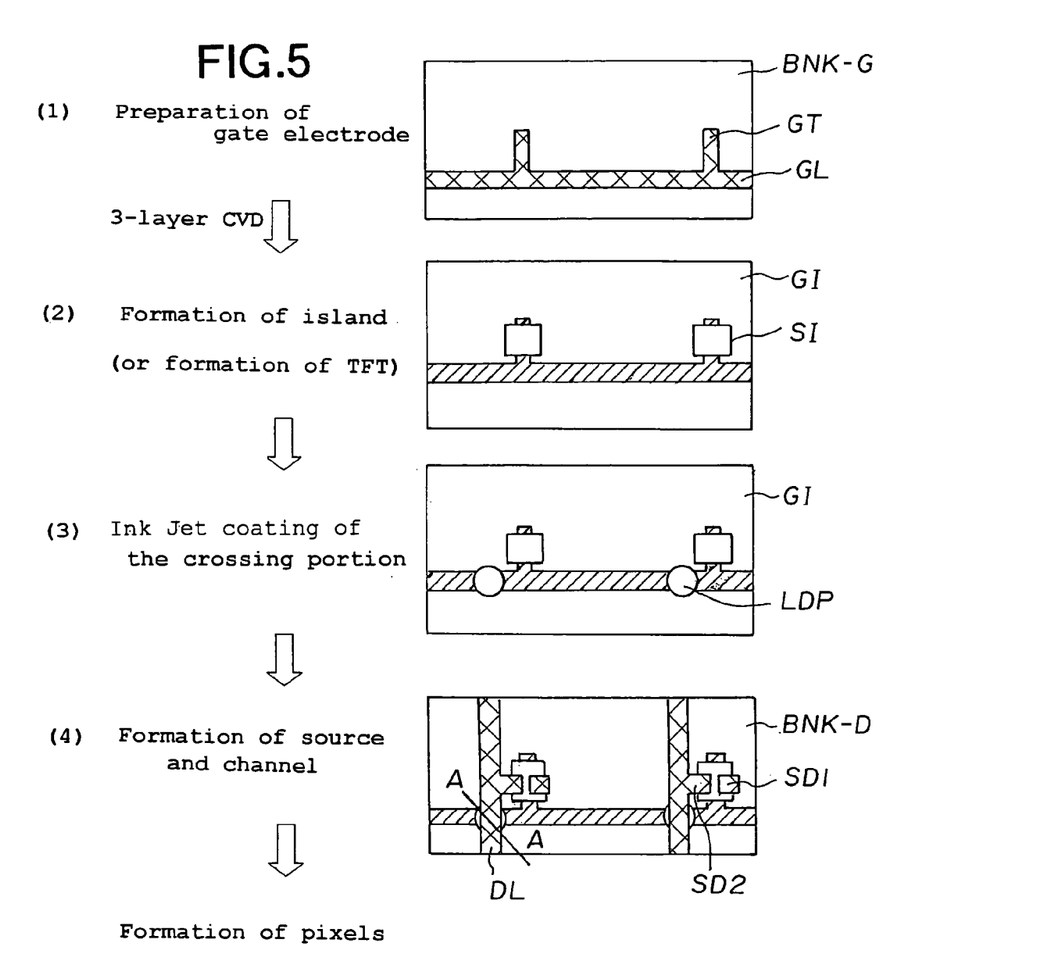
FIG. 5 represents plan views to explain essential processes of a method for manufacturing the active matrix substrate of the liquid crystal display panel, which constitutes Embodiment 3 of the liquid crystal display device of the present invention.

FIG. 5 represents plan views to explain essential processes of a method for manufacturing an active matrix substrate of a liquid crystal display panel, which makes up Embodiment 3 of the liquid crystal display device according to the present invention. In Embodiment 3, the gate line and the data line are also prepared by ink jet coating. Description will be given now on the processes to prepare the data line, the source electrode and drain electrode in the order of (1) to (4). First, (1) Preparation of the gate electrode: A gate line and a bank BNK-G to form a groove on the pattern of the gate electrode are provided on the surface of an insulating substrate—preferably a transparent glass substrate. The bank BNK-G and its groove are prepared from a photosensitive resist by photolithographic method. This is the same in the other embodiments. An ink containing conductive particles such as silver or copper is dropped into the groove of the bank BNK-G by ink jet coating and the groove is filled. When the ink is dried up, the gate line GL and the gate electrode GT are prepared by baking.

(2) Preparation of island: A gate insulator GI of SiNx by CVD is deposited over the entire substrate including the gate line GL, the gate electrode GT and the bank BNK-G. Then, by similar CVD processing, an amorphous silicon semiconductor layer and an n+ silicon semiconductor layer (ohmic contact layer) with silicon intermingled with phosphor or the like as impurities are deposited. By processing the ohmic contact layer, which has been turned to the amorphous silicon semiconductor layer, a silicon semiconductor island SI is prepared on upper portion of the gate electrode GT. In this case, the ohmic contact layer prepared on the upper layer of the island SI is separately provided as connecting regions of a source electrode and drain electrode respectively.

(3) Ink jet coating of the crossing portion: On the gate insulator GI of the gate line and only on the crossing portion where the data line crosses, an insulating material with low dielectric constant is dropped and coated by ink jet coating, and an insulating layer LDP with low dielectric constant is prepared.

(4) Formation of source and channel: On the surface of the insulating substrate, a data line, a bank BNK-D to form groove on pattern of the source electrode and the drain electrode is provided. The bank BNK-D and its groove are prepared from a photosensitive resist by photolithographic method. This is the same in the other embodiments. An ink containing conductive particles such as silver and copper is dropped into the groove of the bank BNK-D and the groove is filled. When this is dried up, a data line DL, a source electrode SD1 and a drain electrode SD2 are prepared by baking. In this case, a channel is formed between the source electrode SD1 and the drain electrode SD2. Then, an active matrix substrate is prepared through pixel forming process such as the formation of a protective film and a pixel electrode and through coating process to coat an orientation film.

Figure 6:
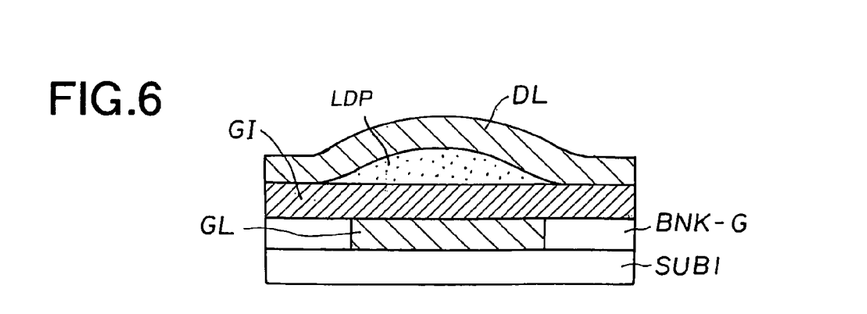
FIG. 6 is a cross-sectional view along the line A-A of the active matrix substrate when data lines are prepared in a process (4) as shown in FIG. 5.

FIG. 6 is a cross-sectional view of an active matrix substrate along the line A-A with the data line prepared in the process (4) of FIG. 5. As shown in the figure, the gate line GL is prepared in the groove of the bank BNK-G formed on the surface of a glass substrate SUB1. A gate insulator GI is prepared over the entire surface of the glass substrate SUB1 to cover the gate line GL. On the gate insulator GI, an ink of an insulating material with low dielectric constant such as aromatic hydrocarbon type organic polymer or polyallyl ether type organic polymer is dropped by ink jet coating on the gate line GL and on the gate line GL on a portion where the data line intersects. When this ink is dried up, it is turned to an insulator LDP with low dielectric constant.

On the 2-layer insulating structure of the gate insulator GI and the insulator LDP with low dielectric constant, the data line DL is prepared to cross it. As shown in FIG. 6, the gate insulator GI is formed flatly on the bank BNK-G. Peripheral edge of the insulator LD with low dielectric constant prepared by ink jet coating and hardened is formed in a tapered form with gentle slope. As a result, the data line DL to cross the gate line GL goes over the gate line GL with gentle slope, and disconnection caused by skip-over when jumping at steep angle can be avoided. Between the data line DL and a counter electrode on a color filter substrate (not shown), there is no dielectric substance, which narrows down the distance between electrodes except the intersection as described above.

According to Embodiment 3, it is possible to improve performance characteristics of the thin-film transistor without increasing cross capacity and counter capacity and to provide a liquid crystal display device to be operated at high speed and with high precision.

Embodiment 4

Figure 7:
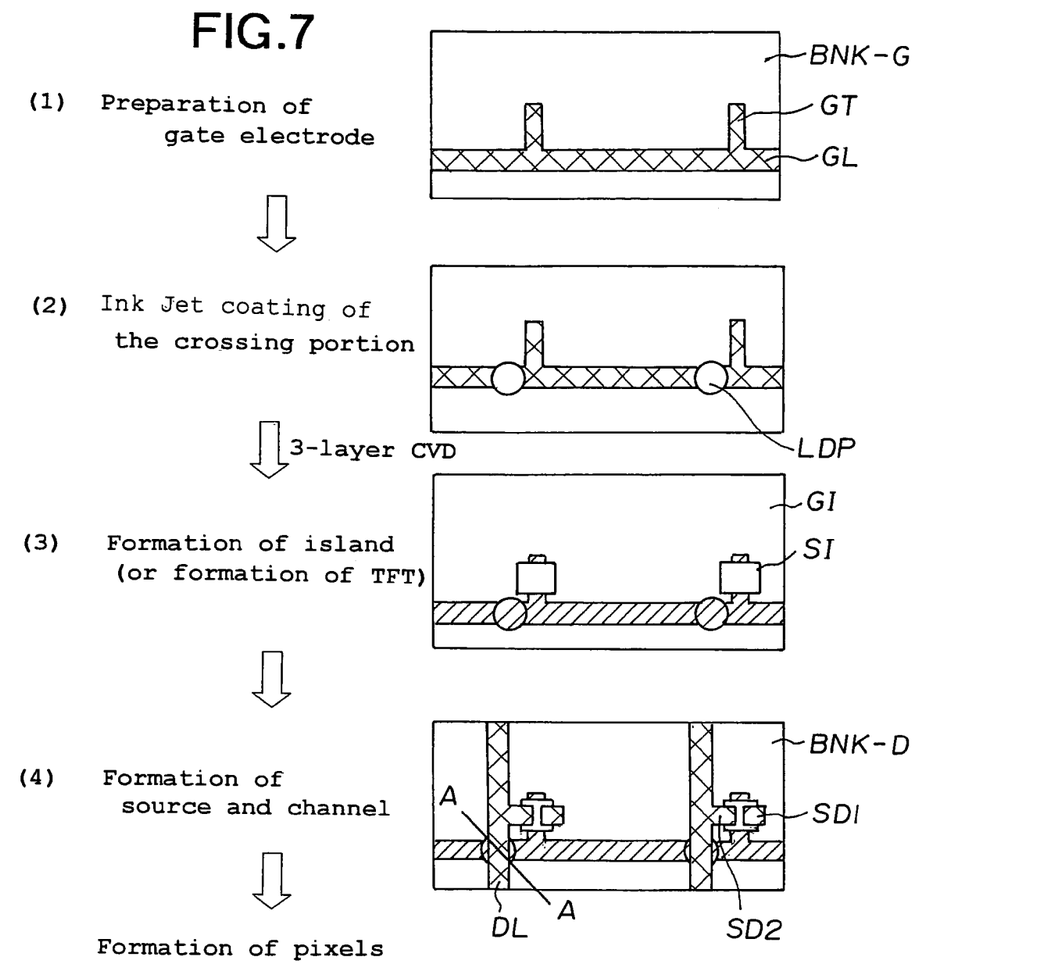
FIG. 7 represents plan views to explain essential processes of a method for manufacturing the active matrix substrate of the liquid crystal display panel, which constitutes Embodiment 4 of the liquid crystal display device of the present invention.

FIG. 7 represents plan views to explain essential processes of a method for manufacturing an active matrix substrate of a liquid crystal display panel, which makes up Embodiment 4 of the liquid crystal display device of the present invention. Similarly to Embodiment 3, the gate line and data line are prepared in Embodiment 4 by ink jet coating method. Here again, description will be given on the process to prepare the data line, the source electrode and the drain electrode in the order of (1) to (4). First, (1) Preparation of gate electrode: On the surface of an insulating substrate—preferably a transparent glass substrate, a gate line and a bank BNK-G to form a groove on the pattern of the gate line and gate electrode are provided. An ink containing conductive particles such as silver or copper is dropped into the groove of the bank BNK-G to fill it. Then, this is dried up, and a gate line GL and a gate electrode GT are prepared by baking.

(2) Ink jet coating of the crossing portion: On the gate insulator GI of the gate line and only on the crossing portion where the data line crosses, an insulating material with low dielectric constant is dropped by ink jet process, and an insulator LDP with low dielectric constant is prepared.

(3) Preparation of island: A gate insulator GI is deposited over the entire surface of the substrate including the gate line GL, the gate electrode GT, and the bank BNK-G. To prepare the gate insulator GI, silicon nitride (SiNx) is deposited by CVD. Then, by similar CVD processing, an amorphous silicon semiconductor layer and an n$^+$ silicon semiconductor layer (ohmic contact layer) with silicon intermingled with phosphor or the like as impurities are deposited. By processing the ohmic contact layer, which has been turned to the amorphous silicon semiconductor layer, a silicon semiconductor island SI is prepared on upper portion of the gate electrode GT. In this case, the ohmic contact layer formed on the upper layer of the island SI is separately provided as connecting regions of a source electrode and a drain electrode respectively.

(4) Formation of source and channel: On the surface of the insulating substrate, a data line and a bank BNK-D with groove formed on the pattern of the source electrode and the drain electrode are disposed. An ink with conductive particles such as silver or copper is dropped into the groove of the bank BNK-D to fill it. Then, this is dried up, and the data line DL, a source electrode SD1, and a drain electrode SD2 are prepared. In addition, a channel is formed between the source electrode SD1 and the drain electrode SD2. Then, the active matrix substrate is prepared through pixel forming process to form a protective film and a pixel electrode and through coating process to coat an orientation film.

Figure 8:
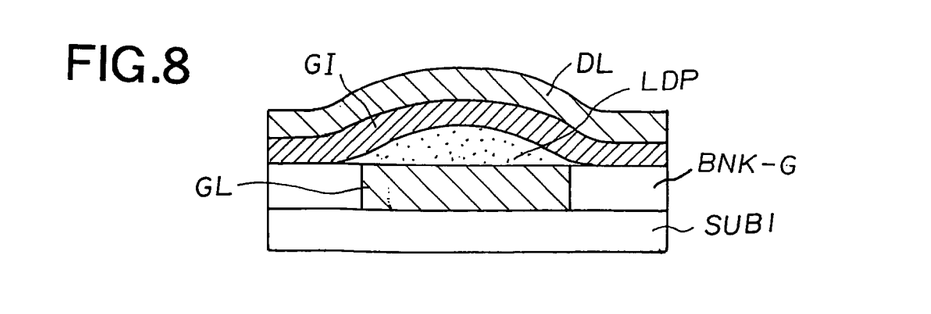
FIG. 8 is a cross-sectional view along the line A-A of the active matrix substrate when data lines are prepared in a process (4) as shown in FIG. 7.

FIG. 8 is a cross-sectional view of an active matrix substrate along the line A-A with the data line prepared in the process (4) of FIG. 7. As shown in the figure, a gate line GL is prepared in the groove of the bank BNK-G formed on the surface of the glass substrate SUB1. On the gate line GL on a portion where the gate line GL crosses the data line and on the gate insulator GI, an ink of an insulating material with low dielectric constant such as aromatic hydrocarbon type organic polymer, polyallyl ether type organic polymer, etc. is dropped by ink jet coating. When this ink is dried up, it is turned to an insulator LDP with low dielectric constant. The gate insulator GI is prepared over the entire surface of the glass substrate SUB1 to cover the insulator LDP with low dielectric constant.

On the 2-layer insulating structure of the insulator LDP with low dielectric constant and the gate insulator GI, the data lines DL are formed to cross. As shown in FIG. 8, in the gate insulator GI formed on the insulator LDP with low dielectric constant, peripheral edge is prepared with gentle slope because of the bank BNK-G. As a result, disconnection can be avoided, which may be caused by skip-over when the data line DL crossing the gate line GL goes with gentle slope over the gate line GL. Also, between the data line DL and a counter electrode of a color filter substrate (not shown), there is no dielectric substance, which narrows down distance between electrodes except at the intersection.

According to Embodiment 4, it is possible to improve performance characteristics of the thin-film transistor without increasing cross capacity and counter capacity and to provide a liquid crystal display device to be operated at high speed and with high precision.

Embodiment 5

Figure 9:
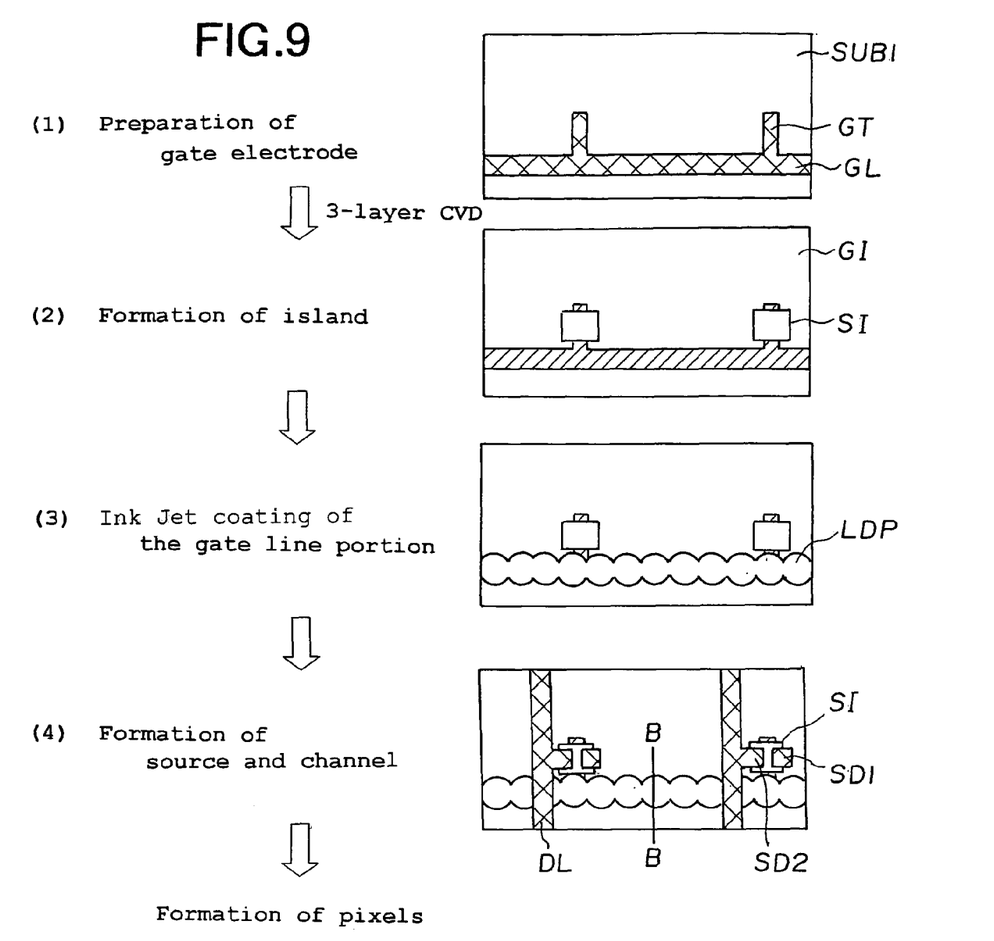
FIG. 9 represents plan views to explain essential processes of a method for manufacturing the active matrix substrate of the liquid crystal display panel, which constitutes Embodiment 5 of the liquid crystal display device of the present invention.

FIG. 9 represents plan views to explain essential processes of a method for manufacturing an active matrix substrate of a liquid crystal display panel, which makes up Embodiment 5 of the liquid crystal display device of the present invention. Here again, description will be given on the processes to prepare the data line, the source electrode, and the drain electrode in the order of (1) to (4). First, (1) Preparation of gate electrode: A gate line GL is prepared by patterning on the surface of an insulating substrate—preferably a transparent glass substrate. On the gate line GL, a gate electrode GT of the thin-film transistor is prepared to protrude.

(2) Preparation of an island: A gate insulator GI is deposited to cover the entire surface of the substrate including the gate line GL and the gate electrode GT. The insulator GI is prepared by depositing silicon nitride (SiNx) by CVD. Then, an amorphous silicon semiconductor layer and an n$^+$ silicon semiconductor layer (ohmic contact layer) with silicon intermingled with phosphor or the like as impurities are deposited by similar CVD processing. By processing the ohmic contact layer, which has been turned to the amorphous silicon semiconductor layer, a silicon semiconductor island SI is prepared on upper portion of the gate electrode GT. In this case, the ohmic contact layer formed on the upper layer of the island SI is separately provided as connecting regions of the source electrode and the drain electrode respectively.

(3) Ink jet coating of gate line: On the gate insulator GI of the gate line and not only on the crossing portion where data line crosses but also along the gate line GL, an ink of an insulating material with low dielectric constant is dropped by ink jet process, and an insulator LDP with low dielectric constant is formed. The insulator LDP with low dielectric constant is prepared on upper layers of all of the gate lines GL at least within a display region (a region where a multiple of pixels are arranged in matrix-like form) of the active matrix substrate.

(4) Formation of source and channel: On the gate insulator GI and on the insulator LDP with low dielectric constant on the crossing gate line GL, a source line, i.e. a data line DL, is prepared. In this case, the source electrode SD1 of the thin-film transistor and the drain electrode are prepared at the same time by patterning, and a channel is formed between the source electrode SD1 and the drain electrode. Then, an active matrix substrate is prepared through pixel forming process to form a protective film and a pixel electrode, and through coating process to coat an orientation film.

Figure 10:
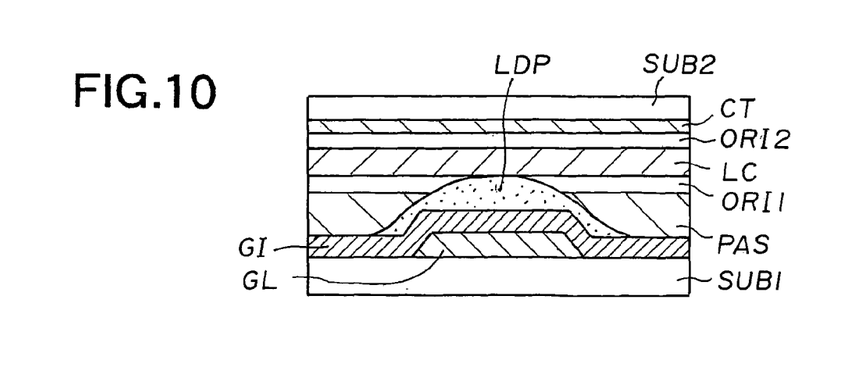
FIG. 10 is a cross-sectional view of the active matrix substrate along the line B-B when data lines are prepared in the process (4) of FIG. 9 and another substrate is attached to seal the liquid crystal.

FIG. 10 is a cross-sectional view of an active matrix substrate along the line B-B with the data line prepared in the process (4) of FIG. 9, and a liquid crystal is sealed by attaching another substrate on it. As shown in the figure, a gate line GL is prepared on the surface of the glass substrate SUB1, which makes up the active matrix substrate. The gate insulator GI is formed on the entire surface of the glass substrate SUB1 to cover the gate line GL. On the gate line GL and on the gate line GL of a portion where data line crosses and on the gate insulator GI, an ink of an insulating material with low dielectric constant such as aromatic hydrocarbon type organic polymer, polyallyl ether type organic polymer, etc. is dropped by ink jet coating. When this ink is dried up, it is turned to an insulator LDP with low dielectric constant on the insulator GI along the gate line GL.

On the 2-layer insulating structure of the gate insulator GI and the insulator LDP with low dielectric constant, the data line DL is prepared to cross. As shown in FIG. 10, peripheral edge of the insulator LDF with low dielectric constant is formed in a tapered form with gentle slope. As a result, disconnection can be avoided, which may be caused by skip-over when the data line DL crossing the gate line GL goes over the gate line GL at a steep angle. Also, between the data line DL and a counter electrode CT of the color filter substrate SUB2, there is no dielectric substance, which narrows down the distance between electrodes except the portion of the gate line GL including the intersection as described above. A liquid crystal LC is sealed between an orientation film ORI1 on the active matrix substrate SUB1 and an orientation film ORI2 on the color filter substrate SUB2.

According to Embodiment 5, cross capacity and counter capacity are not increased. Between the signal lines such as data line and the counter electrode, there is only an insulator LDP with low dielectric constant on the gate line GL as a dielectric substance to narrow down the distance between electrodes, and it is not a structure to extensively increase the capacity. For this reason, it is possible to provide a liquid crystal display device to be operated at high speed and with high precision without decreasing the performance characteristics of the thin-film transistor.

Embodiment 6

Figure 11:
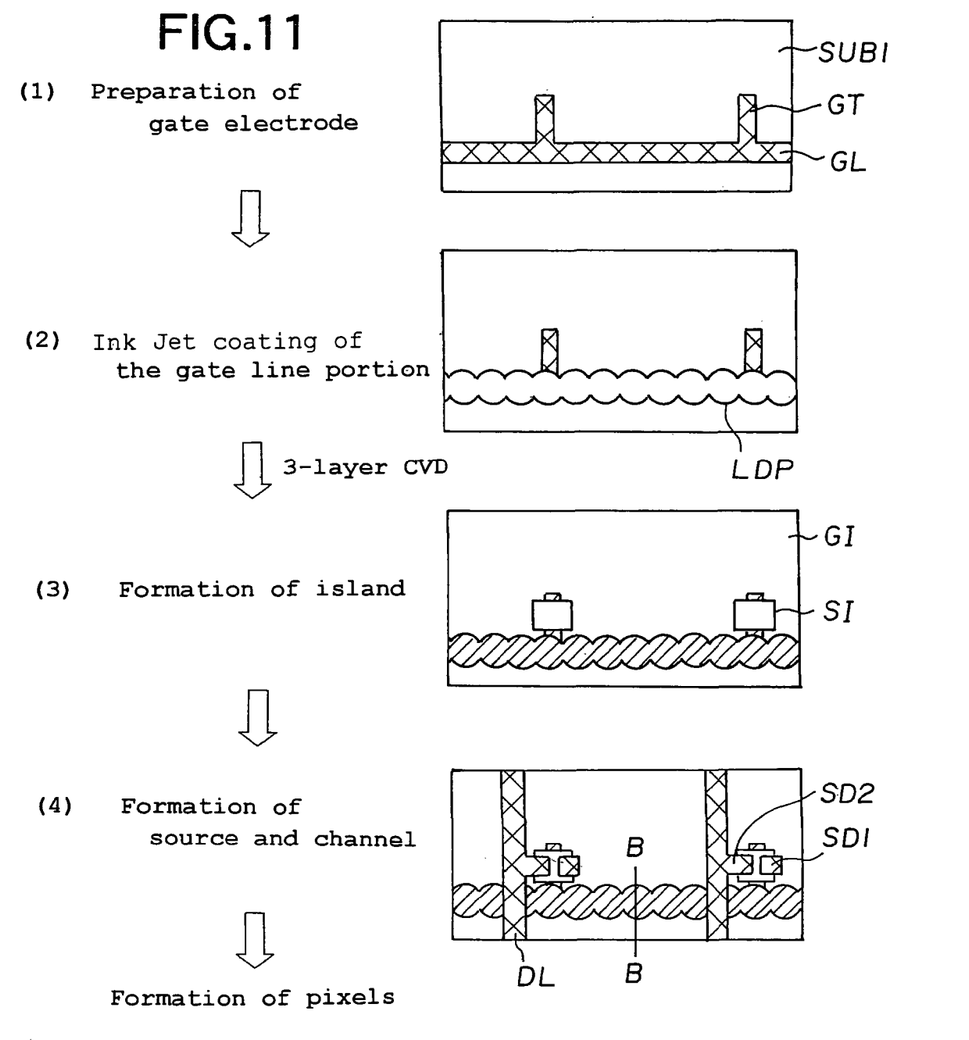
FIG. 11 represents plan views to explain essential processes of a method for manufacturing the active matrix substrate of the liquid crystal display panel, which constitutes Embodiment 6 of the liquid crystal display device of the present invention.

FIG. 11 represents plan views to explain essential processes of a method for manufacturing an active matrix substrate of a liquid crystal display panel, which makes up Embodiment 6 of the liquid crystal display device of the present invention. Here again, description will be given on the processes to prepare the data line, the source electrode, and the drain electrode in the order of (1) to (4). First, (1) Preparation of gate electrode: A gate line GL is prepared by patterning on the surface of an insulating substrate—preferably a transparent glass substrate. On the gate line GL, a gate electrode GT of the thin-film transistor is formed to protrude.

(2) Ink jet coating of the gate line: On the gate line, not only on the crossing portion where data line crosses but also along the gate line GL, an insulating material with low dielectric constant is dropped and coated, and an insulator LDP with low dielectric constant is prepared. The insulator LDP with low dielectric constant is prepared on upper layers of all gate lines GL at least within a display region (a region where a multiple of pixels are arranged in matrix-like form) of the active matrix substrate.

(3) Preparation of island: A gate insulator GI is deposited on the gate line GL, the gate electrode GT, and over the entire surface of the substrate including the insulator LDP with low dielectric constant. To prepare the gate insulator GI, silicon nitride (SiNx) is deposited by CVD. Then, by similar CVD processing, an amorphous silicon semiconductor layer and an $n^+$ silicon semiconductor layer (ohmic contact layer) with silicon intermingled with phosphor or the like as impurities are deposited. By processing the ohmic contact layer, which has been turned to the amorphous silicon semiconductor layer, a silicon semiconductor island SI is prepared on upper portion of the gate electrode GT. In this case, the ohmic contact layer prepared on the upper layer of the island SI is separately provided as connecting regions of the source electrode and the drain electrode respectively.

(4) Formation of source and channel: On the gate insulator GI and on the insulator LDP with low dielectric constant on the intersecting gate line GL, a source line, i.e. a data line DL, is prepared. In this case, patterning is performed at the same time on the source electrode SD1 and the drain electrode of the thin-film transistor, and a channel is formed between the source electrode SD1 and the drain electrode. Then, an active matrix substrate is prepared through pixel forming process to form a protective film and a pixel electrode and through coating process to coat an orientation film.

Figure 12:
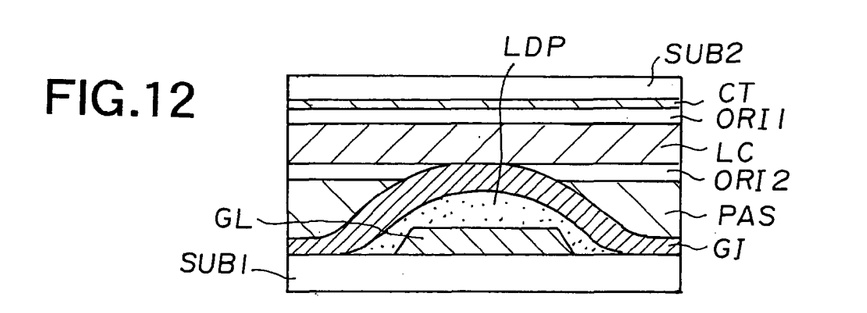
FIG. 12 is a cross-sectional view of the active matrix substrate along the line B-B when data lines are prepared in the process (4) of FIG. 11 and another substrate is attached to seal the liquid crystal.

FIG. 12 is a cross-sectional view of an active matrix substrate along the line B-B with the data line prepared in the process (4) of FIG. 11, and a liquid crystal is sealed by attaching another substrate. As shown in the figure, the gate line GL is prepared on the surface of the glass substrate SUB1, which makes up the active matrix substrate. An insulator LDP with low dielectric constant is prepared on the gate line GL including a portion where data line crosses and a gate insulator GI is prepared on it. To prepare the insulator LDP with low dielectric constant, an ink of an insulating material with low dielectric constant such as aromatic hydrocarbon type organic polymer, polyallyl ether type organic polymer, etc. is dropped by ink jet coating method. When it is dried up, it is turned to an insulator LDP with low dielectric constant on the gate insulator GI along the gate line GL.

On the 2-layer insulating structure of the insulator LDP with low dielectric constant and the gate insulator GI, the data line DL is prepared to cross. As shown in FIG. 12, when ink is dropped by ink jet coating method and is hardened, peripheral edge of the insulator LDP with low dielectric constant is prepared in a tapered form with gentle slope. As a result, the data line DL crossing the gate line GL goes over the gate line GL at gentle slope, and disconnection can be avoided, which may be caused by skip-over when jumping at a steep angle. Also, between the data line DL and the counter electrode CT of the color filter substrate SUB2, there is no dielectric substance, which narrows down the distance between electrodes except a portion of the gate line GL including the intersection as described above. A liquid crystal LC is sealed between an orientation film ORI1 on the active matrix substrate SUB1 and an orientation film ORI2 on the color filter substrate SUB2.

According to Embodiment 6, cross capacity and counter capacity are not increased. Between the signal lines such as data line and the counter electrode, there is only an insulator LDP with low dielectric constant on the gate line as a dielectric substance to narrow down the distance between electrodes, and it is not a structure to extensively increase the capacity. For this reason, it is possible to provide a liquid crystal display device to be operated at high speed and with high precision without decreasing the performance characteristics of the thin-film transistor.

Embodiment 7

Figure 13:
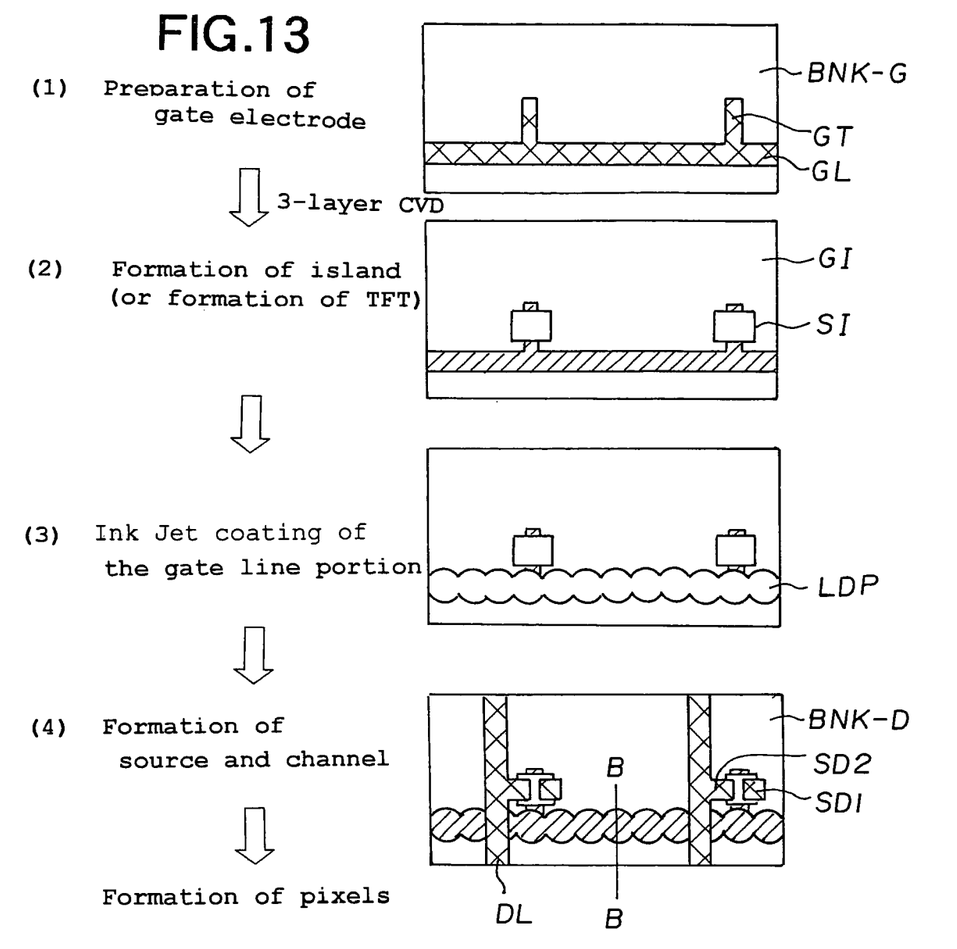
FIG. 13 represents plan views to explain essential processes of a method for manufacturing the active matrix substrate of the liquid crystal display panel, which constitutes Embodiment 7 of the liquid crystal display device of the present invention.

FIG. 13 represents plan views to explain essential processes of a method for manufacturing an active matrix substrate of a liquid crystal display panel, which makes up Embodiment 7 of the liquid crystal display device of the present invention. Here again, description will be given on the processes to prepare the data line, the source electrode and the drain electrode in the order of (1) to (4). First, (1) Preparation of gate electrode: A gate line and a bank BNK-G with groove pattern of the gate electrode are prepared on the surface of the insulating substrate—preferably a transparent glass substrate. An ink containing conductive particles such as silver or copper is dropped into the grooves of the bank BNK-G by ink jet coating method. It is then dried up, and a gate line GL and a gate electrode GT are prepared by baking.

(2) Preparation of island: A gate insulator GI is deposited over the entire surface of the substrate including the gate line GL, the gate electrode GT and the bank BNK-G. To prepare the gate insulator GI, silicon nitride (SiNx) is deposited by CVD. Then, by similar CVD processing, an amorphous silicon semiconductor layer and an $n^+$ silicon semiconductor layer (ohmic contact layer) with silicon intermingled with phosphor or the like as impurities are deposited. By processing the ohmic contact layer, which has been turned to the amorphous silicon semiconductor layer, a semiconductor island SI is prepared on upper portion of the gate electrode GT. In this case, the ohmic contact layer prepared on the upper layer of the island SI is provided separately as connecting regions of the source electrode and the drain electrode respectively.

(3) Ink jet coating of the gate line: On the gate insulator GI of the gate line, and not only on the crossing portion where data line crosses but also along the gate line GL, an ink of an insulating material with low dielectric constant is dropped by ink jet coating method, and an insulator LDP with low dielectric constant is prepared. The insulator LDP with low dielectric constant is formed on upper layers of all gate lines GL at least within a display region (a region where a multiple of pixels are arranged in matrix-like form) of the active matrix substrate.

(4) Formation of source and channel: On the gate insulator GI, and on the insulator LDP with low dielectric constant on the crossing gate line GL, the data line, and the bank BNK-D with groove pattern of the source electrode SD1 and the drain electrode SD2 are prepared. An ink containing conductive particles such as silver or copper is dropped into the groove of the bank BNK-G. Then, it is dried up, and the source line, i.e. the data line DL, and the source electrode SD1 and the drain electrode SD2 are prepared by baking. In this case, a channel is formed between the source electrode SD1 and the drain electrode. Then, an active matrix substrate is prepared through pixel forming process to form a protective film, a pixel electrode, etc. and through coating process to coat the orientation film.

Figure 14:
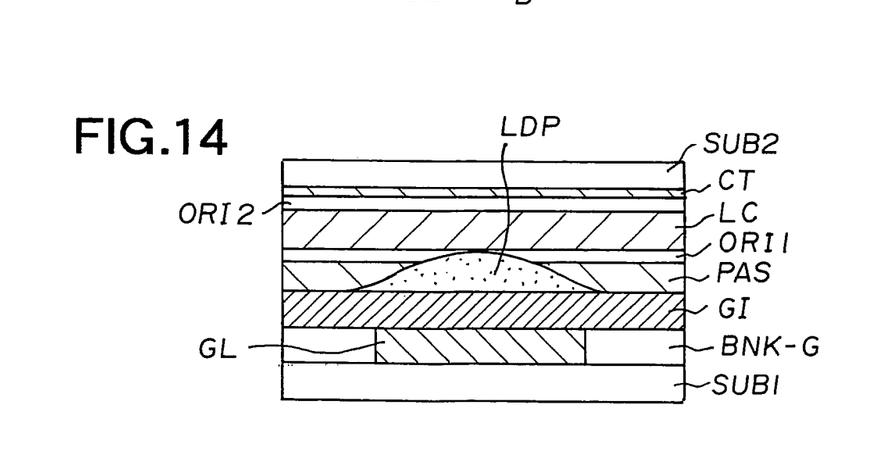
FIG. 14 is a cross-sectional view of the active matrix substrate along the line B-B when data lines are prepared in the process (4) of FIG. 13 and another substrate is attached to seal the liquid crystal.

FIG. 14 is a cross-sectional view of an active-matrix substrate along the line B-B with data line prepared in the process (4) of FIG. 13, and the liquid crystal is sealed by attaching another substrate. As shown in the figure, a gate line GL is prepared on the entire surface of the glass substrate SUB1, which constitutes the active matrix substrate. A gate insulator GI is prepared over the entire surface of the glass substrate SUB1 to cover the gate line GL. The gate insulator GI is prepared in flat form because of the presence of the bank BNK-G. On the gate line where the gate line GL and the data line intersect, and on the gate insulator GI, an ink of an insulating material with low dielectric constant such as aromatic hydrocarbon type organic polymer, polyallyl ether type organic polymer, etc. is dropped by ink jet coating. When the ink is dried up, it is turned to an insulator LDP with low dielectric constant on the gate insulator GI along the gate line GL.

On the 2-layer insulating structure comprising the gate insulator GI and the insulator LDP with low dielectric constant, a data line DL is prepared to cross. As shown in FIG. 14, when ink is dropped by ink jet coating method and is hardened, peripheral edge of the insulator LD with low dielectric constant is formed in a tapered form with gentle slope. As a result, the data line DL crossing the gate line GL goes over the gate line GL with gentle slope, and disconnection can be avoided, which may be caused by skip-over when jumping at a steep angle. Also, between the data line DL and the counter electrode CT of the color filter substrate SUB2, there is no dielectric substance, which narrows down the distance between electrodes except a portion of the gate line GL including the intersection as described above. A liquid crystal LC is sealed between an orientation film ORI1 on the active matrix substrate SUB1 and an orientation film ORI2 on the color filter substrate SUB2.

According to Embodiment 7, cross capacity and counter capacity are not increased. Between the signal lines such as data line and the counter electrode, there is only an insulator LDP with low dielectric constant on the gate line as a dielectric substance to narrow down the distance between electrodes, and it is not a structure to extensively increase the capacity. For this reason, it is possible to provide a liquid crystal display device to be operated at high speed and with high precision without decreasing the performance characteristics of the thin-film transistor.

Embodiment 8

Figure 15:
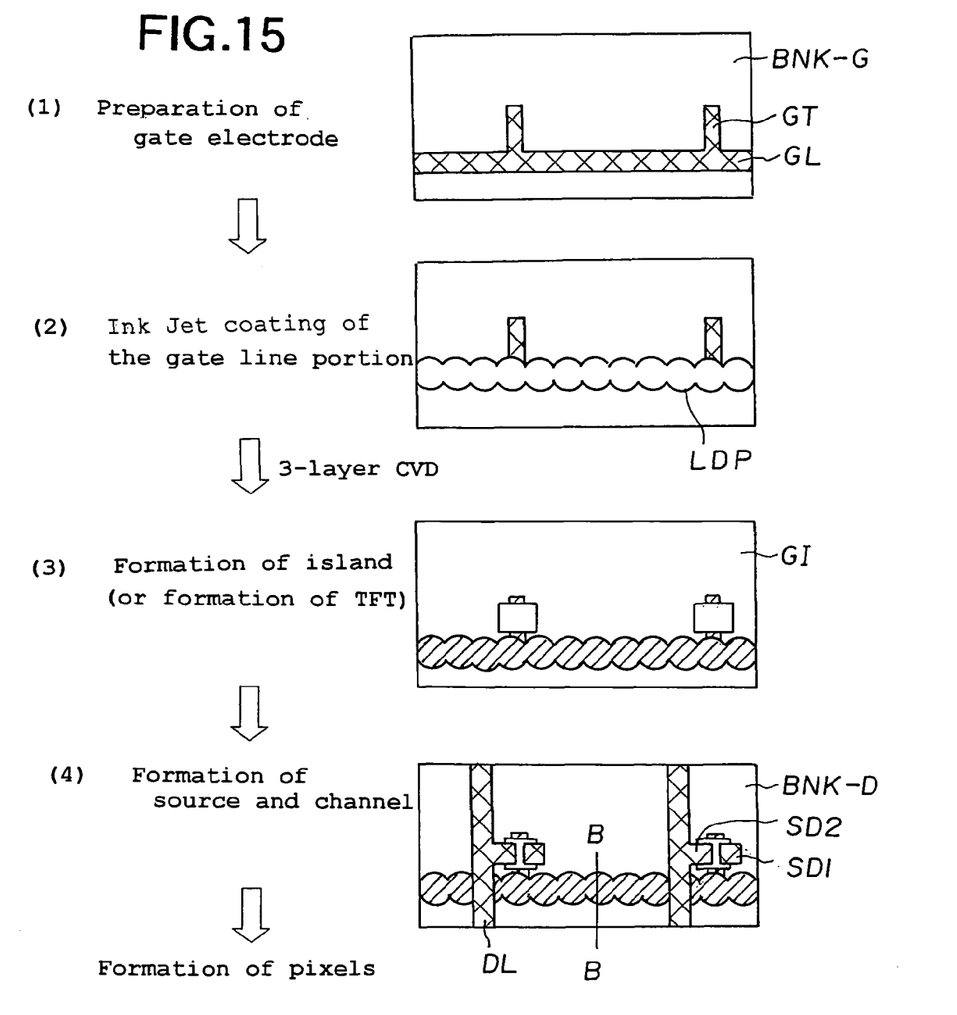
FIG. 15 represents plan views to explain essential processes of a method for manufacturing the active matrix substrate of the liquid crystal display panel, which constitutes Embodiment 8 of the liquid crystal display device of the present invention.

FIG. 15 represents plan views to explain essential processes of a method for manufacturing an active matrix substrate of a liquid crystal display panel, which makes up Embodiment 8 of the liquid crystal display device of the present invention. Here again, description will be given on the processes to prepare the data line, the source electrode and the drain electrode in the order of (1) to (4). First, (1) Preparation of gate electrode: A gate line and a bank BNK-G with groove pattern of the gate electrode are prepared on the surface of the insulating substrate—preferably a transparent glass substrate. An ink containing conductive particles such as silver or copper is dropped into the grooves of the bank BNK-G by ink jet coating method. It is then dried up, and a gate line GL and a gate electrode GT are prepared by baking.

(2) Ink jet coating of the gate line: On the gate insulator GI of the gate line, and not only on the crossing portion where data line crosses but also along the gate line GL, an ink of an insulating material with low dielectric constant is dropped by ink jet coating method, and an insulator LDP with low dielectric constant is prepared. The insulator LDP with low dielectric constant is formed on upper layers of all gate lines GL at least within a display region (a region where a multiple of pixels are arranged in matrix-like form) of the active matrix substrate.

(3) Preparation of island: A gate insulator GI is deposited over the entire surface of the substrate including the gate line GL, the gate electrode GT and the bank BNK-G. To prepare the gate insulator GI, silicon nitride (SiNx) is deposited by CVD. Then, by similar CVD processing, an amorphous silicon semiconductor layer and an n$^+$ silicon semiconductor layer (ohmic contact layer) with silicon intermingled with phosphor or the like as impurities are deposited. By processing the ohmic contact layer, which has been turned to the amorphous silicon semiconductor layer, a semiconductor island SI is prepared on upper portion of the gate electrode GT. In this case, the ohmic contact layer prepared on the upper layer of the island SI is provided separately as connecting regions of the source electrode and the drain electrode respectively.

(4) Formation of source and channel: On the gate insulator GI, and on the insulator LDP with low dielectric constant on the crossing gate line GL, the data line, and the bank BNK-D with groove pattern of the source electrode SD1 and the drain electrode SD2 are prepared. An ink containing conductive particles such as silver or copper is dropped into the groove of the bank BNK-G. Then, it is dried up, and the source line, i.e. the data line DL, and the source electrode SD1 and the drain electrode SD2 are prepared by baking. In this case, a channel is formed between the source electrode SD1 and the drain electrode. Then, an active matrix substrate is prepared through pixel forming process to form a protective film, a pixel electrode, etc. and through coating process to coat the orientation film.

Figure 16:
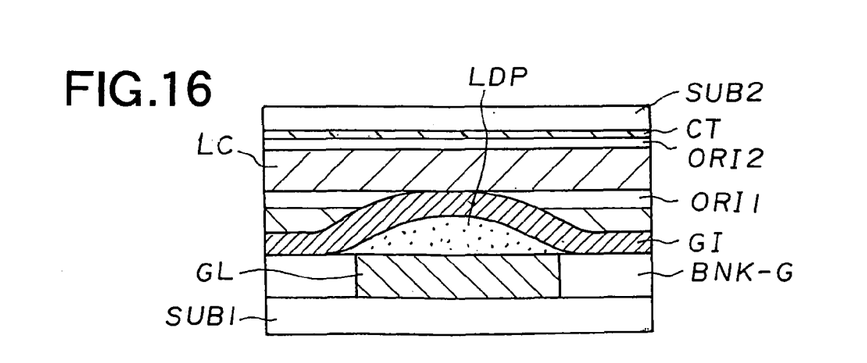
FIG. 16 is a cross-sectional view of the active matrix substrate along the line B-B when data lines are prepared in the process (4) of FIG. 15 and another substrate is attached to seal the liquid crystal.

FIG. 16 is a cross-sectional view of an active matrix substrate along the line B-B with data line prepared in the process (4) of FIG. 15 with the liquid crystal sealed by attaching another substrate. As shown in the figure, a gate line GL is prepared on the surface of the glass substrate SUB1, which makes up the active matrix substrate. Including a portion where the gate line GL and the data line DL intersect, an ink of an insulating material with low dielectric constant such as aromatic hydrocarbon type organic polymer, polyallyl ether type organic polymer, etc. is dropped by ink jet coating method. When the ink is dried up, it is turned to an insulator LDP with low dielectric constant on the gate insulator GI along the gate line GL. A gate insulator GI is prepared on it. The gate insulator GI is prepared in flat form because of the presence of the bank BNK-G.

On the 2-layer insulating structure comprising the insulator LDP with low dielectric constant and the gate insulator GI, the data line DL is prepared to cross. As shown in FIG. 16, when ink is dropped by ink jet coating method and is hardened, peripheral edge of the insulator LDP with low dielectric constant is formed in a tapered form with gentle slope. As a result, the data line intersecting the gate line GL goes over the gate line GL at a gentle angle, and disconnection can be avoided, which may be caused by skip-over when jumping at a steep angle. Also, between the data line DL and the counter electrode CT of the color filter substrate SUB2, there is no dielectric substance, which narrows down the distance between electrodes except a portion of the gate line GL including intersection as described above. A liquid crystal LC is sealed between an orientation film ORI1 on the active matrix substrate SUB1 and an orientation film ORI2 on the color filter substrate SUB2.

According to Embodiment 8, cross capacity and counter capacity are not increased. Between the signal lines such as data line and the counter electrode, there is only an insulator LDP with low dielectric constant on the gate line as a dielectric substance to narrow down the distance between electrodes, and it is not a structure to extensively increase the capacity. For this reason, it is possible to provide a liquid crystal display device to be operated at high speed and with high precision without decreasing the performance characteristics of the thin-film transistor.

Here, description will be given on concrete effects of the present invention on capacity at the intersection in Embodiment 3 and on the counter electrode in Embodiment 7.

Now, description will be given on capacity at the intersection as described in connection with Embodiment 3 by referring to the cross-sectional structure of FIG. 6. Capacity $C_0$ of the intersection of only the gate insulator GI is given by:

$$C_0 = (\epsilon_{gi}/d_{gi})S = (7.0/0.4)S$$

where $d_{gi}$: Thickness of gate insulator GI (0.4 μm)
$\epsilon_{gi}$: Dielectric constant of gate insulator GI (7.0)
S: Area of intersection when a gate insulator GI is present between the gate line GL and the data line DL at the intersection of both lines.

Here, it is assumed that the thickness of the insulator LDP with low dielectric constant coated on the gate insulator GI by ink jet coating method is d. Then, the capacity C of the intersection is given by:

$$C = C_0\{1/(1 + d\epsilon_{gi}/d_{gi}\epsilon)\}$$

where d: Thickness of the insulator LDP with low dielectric constant
$\epsilon$: Dielectric constant of the insulator LDP with low dielectric constant Here, if it is supposed that the dielectric constant $\epsilon$ of the insulator LDP with low dielectric constant is approximately 3, and when the thickness d of the insulator LDP with low dielectric constant is changed, the capacity C at the intersection is given as:

$$d=0.4\ \mu m \rightarrow C = 0.30\ C_0$$

$$d=0.8\ \mu m \rightarrow C = 0.18\ C_0$$

$$d=1.2\ \mu m \rightarrow C = 0.13\ C_0$$

Now, the counter capacity as explained in connection with Embodiment 7 is now described by referring to the cross-sectional structure shown in FIG. 14. The capacity $C_0$ of the intersection of the gate insulator GI only is given by:

$$C_0 = \{(\epsilon_{gi} \cdot \epsilon_{1c})/(d_{gi}\epsilon_{1c} + d_{1c}\epsilon_{gi})\}S$$

where $d_{gi}$: Thickness of gate insulator GI (0.4 μm)
$\epsilon_{gi}$: Dielectric constant of gate insulator GI(7.0)
$d_{1c}$: Thickness of liquid crystal LC(3.5 μm)
$\epsilon_{1c}$: Dielectric constant of liquid crystal LC(8.5)
S: Area of opposing portion of the gate line GL and the counter electrode CT When the insulator LDP with low dielectric constant is prepared by ink jet coating along the gate insulator GI, the counter capacity C is given by:

$$C = C_0[1/\{(1 + (d\epsilon_{gi}\epsilon_{1c})/(d_{gi}\epsilon_{1c} + d_{1c}\epsilon_{gi})\epsilon\}]$$

where d: Thickness of the insulator LDP with low dielectric constant
$\epsilon$: Dielectric constant of the insulator LDP with low dielectric constant Here, if it is assumed that dielectric constant $\epsilon$ of the insulator LDP with low dielectric constant is approximately 3, and when the thickness d of the insulator LDP with low dielectric constant is changed, the capacity C of the intersection is given by:

$$d=1\ \mu m \rightarrow C = 0.58\ C_0$$

$$d=2\ \mu m \rightarrow C = 0.41\ C_0$$

$$d=3\ \mu m \rightarrow C = 0.32\ C_0$$

The embodiments as described above can be combined as appropriate, and it is needless to say that various changes and modifications of the present invention can be made without departing from the spirit and the scope of the present invention.

What is claimed is:

1. A method for manufacturing a liquid crystal display device with a liquid crystal interposed between a first insulating substrate and a second insulating substrate, said method comprising:

preparing a plurality of gate lines running in parallel to each other on said first insulating substrate;

depositing a gate insulating layer to cover said first insulating substrate including said gate lines;

preparing an insulator with low dielectric constant by ink jet coating method only on said gate insulator at portions where said gate lines and data lines cross each other; and preparing a plurality of said data lines running in parallel to each other by making said gate lines cross on said gate insulating layer and said insulator with low dielectric constant.

2. A method for manufacturing a liquid crystal display device with a liquid crystal interposed between a first insulating substrate and a second insulating substrate, said method comprising:

preparing a plurality of gate lines running in parallel to each other on said first insulating substrate;

preparing an insulator with low dielectric constant by ink jet coating method only on said gate lines at portions where said gate lines and data lines cross each other;

depositing a gate insulating layer to cover said first insulating substrate including said gate lines and said insulator with low dielectric constant; and preparing a plurality of said data lines running in parallel to each other by making said gate lines cross on said insulator with low dielectric constant and said gate insulating layer.

3. A method for manufacturing a liquid crystal display device according to claim 1 or claim 2, wherein said insulator with low dielectric constant is a heat-resistant resin.

4. A method for manufacturing a liquid crystal display device according to claim 1 or claim 2, wherein said insulator with low dielectric constant is an aromatic hydrocarbon type organic polymer or a polyallyl ether type organic polymer.

5. A method for manufacturing a liquid crystal display device according to claim 1 or claim 2, said method further comprising:

preparing a thin-film transistor, in which said thin-film transistor has a semiconductor layer on said gate insulating layer and an ohmic contact layer separately provided on a surface of said semiconductor layer, a source electrode and a drain electrode prepared on said ohmic contact layer, and a display region made up with unit pixels to be formed on each portion enclosed by said plurality of gate lines and said plurality of data lines.

* * * * *